United States Patent
Goto

(10) Patent No.: US 7,543,257 B2
(45) Date of Patent: Jun. 2, 2009

(54) APPARATUS FOR GIVING ASSISTANCE IN ANALYZING DEFICIENCY IN RTL-INPUT PROGRAM AND METHOD OF DOING THE SAME

(75) Inventor: Atsuko Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 350 days.

(21) Appl. No.: 11/390,076

(22) Filed: Mar. 28, 2006

(65) Prior Publication Data
US 2006/0225004 A1  Oct. 5, 2006

(30) Foreign Application Priority Data
Mar. 29, 2005  (JP)  ............... 2005-093674

(51) Int. Cl.
*G06F 17/50* (2006.01)
(52) U.S. Cl. .............................. 716/5; 716/4
(58) Field of Classification Search ............ 716/1, 716/4–6, 18; 714/25, 724
See application file for complete search history.

(56) References Cited

U.S. PATENT DOCUMENTS

2004/0049753 A1 * 3/2004 Kabuo ............... 716/6
2005/0055612 A1 * 3/2005 Yamada ............ 714/724

FOREIGN PATENT DOCUMENTS

| JP | 5-242191 | 9/1993 |
| JP | 11-102385 | 4/1999 |
| JP | 2003-085220 A | 3/2003 |

* cited by examiner

*Primary Examiner*—Vuthe Siek
(74) *Attorney, Agent, or Firm*—Foley & Lardner LLP

(57) ABSTRACT

An apparatus for giving assistance in analyzing deficiency in a RTL-input program, includes a partial RTL creator which creates partial RTL description data containing logic description identical with logic description extracted from successive portions of input RTL description data, and having correspondence in signals identical with the same in the input RTL description data, an estimator which receives the partial RTL description data to execute a RTL-input program, and creates error-judgment data indicative of whether the RTL-input program contains deficiency, and an execution controller which controls a volume of logic description contained in partial RTL description data to be next created by the partial RTL creator, based on the error-judgment data, and outputs partial RTL description data causing the same deficiency as deficiency of the input RTL description data, and having a minimum volume of logic description.

11 Claims, 6 Drawing Sheets

FIG.6A if ((N==1) or ((N-1)th detection of error in analyzey 182))
{Nth lower limit = (the previous lower limit) - (M/$2^N$)} else
{Nth lower limit = (the previous lower limit) + (M/$2^N$)}

FIG.6B if ((N==1) or ((N-1)th detection of error in analyzey 182))
{Nth upper limit = (the previous upper limit) + (M/$2^N$)} else
{Nth upper limit = (the previous upper limit) - (M/$2^N$)}

FIG.7 if ((used in left side==ON) & ((type of external-terminal table==OUT)
|| (used in other right sede==ON)))
{storing "OUT" for a direction of pin as output terminal of
intermediate RTL} else if ((used in right side==ON) &
((type of external-terminal table==IN) || (used in other left side==ON)))
{storing "IN" for a direction of pin as input terminal of
intermediate RTL} else {storing "INTERNAL" for a direction of
pin as internal net of intermediate RTL

APPARATUS FOR GIVING ASSISTANCE IN ANALYZING DEFICIENCY IN RTL-INPUT PROGRAM AND METHOD OF DOING THE SAME

RELATED APPLICATIONS

The entire disclosure of Japanese Patent Application No.2005-093674filed on Mar. 29, 2005, including specification, claims, drawings and summary, for which this application claims priority to, is incorporated herein by reference in its entirety.

BACKGROUND OF THE INVENTION

1. Field of the Invention

The invention relates to an apparatus and a method both of which give assistance in analyzing a reason of occurrence of deficiency in a RTL-input program such as a logic synthesizing tool or a logic testing tool.

2. Description of the Related Art

In designing logics in LSI, a hardware is described with a hardware description language (RTL language) of a register transfer level (RTL), and then, the RTL description data is input into a program called a logic synthesizing tool to fabricate a logic circuit, as suggested in Japanese Patent Application Publication No. 2003-85221, for instance.

Before inputting the RTL description data into a logic synthesizing tool, the RTL description data may be input into a program called a logic testing tool in order to check whether a logic circuit expressed in the RTL description data operates in a designed way or has contradictions therein. As an alternative, the RTL description data may be input into a program called a RTL checker to check a logic circuit expressed in the RTL description data.

In the specification, a program receiving RTL description data as input data, such as a logic synthesizing tool, a RTL checker and a logic testing tool, is called a RTL-input program.

An example of a RTL-input program is disclosed in Japanese Patent Application Publication No. 5-242191 (published September 1993). In accordance with the RTL-input program, RTL description data is analyzed to find deficiency in a logic circuit expressed with RTL description data.

Japanese Patent Application Publication No. 11-102385 (published April 1999) has suggested a system for giving assistance in designing LSI logics, including means for, when logic macro as a unit of a logic expressed with RTL language is divided into a plurality of macros, applying description relating to division to the RTL language, and analyzing the description relating to division to divide or unify the logic macro, and means for automatically defining input/output signals of the thus divided or unified macros.

When RTL description data is input into a RTL-input program in order to check or synthesize logics, the RTL-input program sometimes abnormally ends due to an internal error with unknown causes. The causes by which a RTL-input program abnormally ends are considered to be fault in RTL description data and/or bug in a RTL-input program.

However, there is a problem that it usually takes much time to identify the causes. The larger RTL description data is in scale, the more remarkable the problem is.

If a RTL-input program which abnormally ended is provided from a vendor, it would be necessary to provide RTL description data used when the RTL-input program abnormally ended, to the vendor in order to reproduce the error and identify causes for the error, which would be accompanied with another problem of security on RTL description data.

SUMMARY OF THE INVENTION

In view of the above-mentioned problems in the prior art, it is an object of the present invention to provide an apparatus for giving assistance in analyzing deficiency in a RTL-input program, which is capable of identifying causes by which a RTL-input program abnormally ended, in a shorter period of time than the conventional apparatuses.

It is also an object of the present invention to provide an apparatus for giving assistance in analyzing deficiency in a RTL-input program, which is capable of keeping security on RTL description data even when causes by which a RTL-input program abnormally ended are identified.

It is further an object of the present invention to provide a method of giving assistance in analyzing deficiency in a RTL-input program, a program for causing a computer to act as an apparatus for giving assistance in analyzing deficiency in a RTL-input program, a program for causing a computer to carry out a method of giving assistance in analyzing deficiency in a RTL-input program, an apparatus for creating partial RTL description data, a method of creating partial RTL description data, a program for causing a computer to act as an apparatus for creating partial RTL description data, and a program for causing a computer to carry out a method of creating partial RTL description data, all of which are capable of identifying causes by which a RTL-input program abnormally ended, in a shorter period of time than the conventional apparatuses or methods, and further, keeping security on RTL description data even when causes by which a RTL-input program abnormally ended are identified.

Hereinbelow are described apparatuses, methods and programs all in accordance with the present invention through the use of reference numerals used in later described embodiments. The reference numerals are indicated only for the purpose of clearly showing correspondence between claims and the embodiments. It should be noted that the reference numerals are not allowed to interpret claims of the present application.

In one aspect of the present invention, there is provided an apparatus (100) for giving assistance in analyzing deficiency in a RTL-input program, including a partial RTL creator (161) which creates partial RTL description data (135) containing logic description identical with logic description extracted from successive portions of input RTL description data (131), and having correspondence in signals identical with the same in the input RTL description data (131), an estimator (162) which receives the partial RTL description data (135) to execute a RTL-input program (151), and creates error-judgment data (137) indicative of whether the RTL-input program (151) contains deficiency, and an execution controller (163) which controls a volume of logic description contained in partial RTL description data (132) to be next created by the partial RTL creator (161), based on the error-judgment data (137), and outputs partial RTL description data (132) causing the same deficiency as deficiency of the input RTL description data (131), and having a minimum volume of logic description.

The apparatus may further include a memory (115, 117) into which the partial RTL creator (161) stores the partial RTL description data (135) and further the estimator (162) stores the error-judgment data (137).

The apparatus may further include a first memory (115) into which the partial RTL creator (161) stores the partial RTL description data (135), and a second memory (117) into which the estimator (162) stores the error-judgment data (137).

For instance, the partial RTL creator (161) may comprises a data reader (171) which stores external-terminal data into a signal-data table (133), the external-terminal data including a name of a signal of an external terminal of the input RTL description data (131), and a direction of the signal, an internal logic-description extractor (172) which creates intermediate RTL description data (134) including logic description extracted from successive portions of the input RTL description data (131), a signal-data table creator (173) which creates definition/reference data (142) and stores the definition/reference data (142) into the signal-data table (133), the definition/reference data (142) being indicative of whether each of signals in the intermediate RTL description data (134) is defined and referred to either in the intermediate RTL description data (134) or outside the intermediate RTL description data (134), an external-terminal data creator (174) which judges a category of each of signals in the intermediate RTL description data (134) is an output terminal, an input terminal or an internal signal in the intermediate RTL description data (134), based on the external-terminal data (141) and the definition/reference data (142) both stored in the signal-data table (133), and stores the judgment results into the signal-data table (133) as category data (134), and a RTL creator (175) which creates data relating to an external terminal, based on the category data (134) stored in the signal-data table (133), and adds the external-terminal data (141) to the intermediate RTL description data (134) to create partial RTL description data (135).

The apparatus may further include a memory (114, 115) into which the internal logic-description extractor (172) stores the intermediate RTL description data (134) and further the RTL creator (175) stores the partial RTL description data (135).

The apparatus may further include a first memory (114) into which the internal logic-description extractor (172) stores the intermediate RTL description data (134), and a second memory (115) into which the RTL creator (175) stores the partial RTL description data (135).

For instance, the estimator (162) may comprises a RTL-input program executor (181) which, receiving the partial RTL description data (135) as input data, executes a RTL-input program (151), and creates an execution log (136), and an analyzer (182) which analyzes the execution log (136) to create error-judgment data (137) indicative of whether there is deficiency in the RTL-input program (151).

The apparatus may further include a memory (115, 117) into which the RTL-input program executor (181) stores the execution log (136) and further the analyzer (182) stores the error-judgment data (137).

The apparatus may further include a first memory (115) into which the RTL-input program executor (181) stores the execution log (136), and a second memory (117) into which the analyzer (182) stores the error-judgment data (137).

For instance, the execution controller (163) (a) fixates a first limit of a range in which logic description is to be extracted from the input RTL description data (131), at one of first and final logic description sentences of the input RTL description data (131), and sets a second limit of the range variable, (b) determines partial RTL description data (132) which includes logic description sentences starting from a logic description sentence disposed at the fixated first limit in the input RTL description data (131), causes the same deficiency as deficiency of the input RTL description data (131), and has a minimum volume of logic description, (c) fixates the second limit at a logic description sentence disposed at a limit of the thus determined partial RTL description data (132), and sets the fixated first limit variable, and (d) determines partial RTL description data (132) which includes logic description sentences starting from a logic description sentence disposed at the fixated limit of the determined partial RTL description data (132), causes the same deficiency as deficiency of the input RTL description data (131), and has a minimum volume of logic description In another aspect of the present invention, there is provided a method of giving assistance in analyzing deficiency in a RTL-input program, including the steps (a) creating partial RTL description data (135) containing logic description identical with logic description extracted from successive portions of input RTL description data (131), and having correspondence in signals identical with the same in the input RTL description data (131), (b) executing a RTL-input program (151) with the partial RTL description data (135) being received as input data to create error-judgment data (137) indicative of whether the RTL-input program (151) contains deficiency, (c) controlling a volume of logic description contained in partial RTL description data (135) to be next created, based on the error-judgment data (137), and (d) outputting partial RTL description data (132) causing the same deficiency as deficiency of the input RTL description data (131), and having a minimum volume of logic description.

The method may further include storing the partial RTL description data (135) and the error-judgment data (137) into a memory (115, 117).

The method may further include storing the partial RTL description data (135) into a first memory (115), and storing the error-judgment data (137) into a second memory (117).

In the method, the step (a) may comprise (a1) storing external-terminal data (141) into a signal-data table (133), the external-terminal data (141) including a name of a signal of an external terminal of the input RTL description data (131), and a direction of the signal, (a2) creating intermediate RTL description data (134) including logic description extracted from successive portions of the input RTL description data (131), (a3) creating definition/reference data (142) and storing the definition/reference data (142) into the signal-data table (133), the definition/reference data (142) being indicative of whether each of signals in the intermediate RTL description data (134) is defined and referred to either in the intermediate RTL description data (134) or outside the intermediate RTL description data (134), (a4) judging a category of each of signals in the intermediate RTL description data (134) is an output terminal, an input terminal or an internal signal in the intermediate RTL description data (134), based on the external-terminal data (141) and the definition/reference data (142) both stored in the signal-data table (133), (a5) storing the judgment results into the signal-data table (133) as category data (143), (a6) creating data relating to an external terminal, based on the category data (143) stored in the signal-data table (133), and (a7) adding the external-terminal data (141) to the intermediate RTL description data (134) to create partial RTL description data (135).

In the method, the step (b) may comprise, on receipt of the partial RTL description data (135) as input data, executing a RTL-input program (151) to create an execution log (136), and analyzing the execution log (136) to create error-judgment data (137) indicative of whether there is deficiency in the RTL-input program (151).

In the method, the step (d) may comprise (d1) fixating a first limit of a range in which logic description is to be extracted from the input RTL description data (131), at one of first and final logic description sentences of the input RTL description data (131), and setting a second limit of the range variable, (d2) determining partial RTL description data (132) which includes logic description sentences starting from a logic description sentence disposed at the fixated first limit in the input RTL description data (131), causes the same deficiency as deficiency of the input RTL description data (131), and has a minimum volume of logic description, (d3) fixating the second limit at a logic description sentence disposed at a limit of the thus determined partial RTL description data (132), and setting the fixated first limit variable, and (d4) determining partial RTL description data (132) which includes logic description sentences starting from a logic description sentence disposed at the fixated limit of the determined partial RTL description data (132), causes the same deficiency as deficiency of the input RTL description data (131), and has a minimum volume of logic description In still another aspect of the present invention, there is provided a program for causing a computer to act as an apparatus for giving assistance in analyzing deficiency in a RTL-input program, the apparatus including a partial RTL creator (161) which creates partial RTL description data (135) containing logic description identical with logic description extracted from successive portions of input RTL description data (131), and having correspondence in signals identical with the same in the input RTL description data (131), an estimator (162) which receives the partial RTL description data (135) to execute a RTL-input program (151), and creates error-judgment data (137) indicative of whether the RTL-input program (151) contains deficiency, and an execution controller (163) which controls a volume of logic description contained in partial RTL description data (132) to be next created by the partial RTL creator (161), based on the error-judgment data (137), and outputs partial RTL description data (132) causing the same deficiency as deficiency of the input RTL description data (131), and having a minimum volume of logic description.

There is further provided a program for causing a computer to carry out a method of giving assistance in analyzing deficiency in a RTL-input program, wherein steps executed by the computer in accordance with the program include (a) creating partial RTL description data (135) containing logic description identical with logic description extracted from successive portions of input RTL description data (131), and having correspondence in signals identical with the same in the input RTL description data (131), (b) executing a RTL-input program (151) with the partial RTL description data (135) being received as input data to create error-judgment data (137) indicative of whether the RTL-input program (151) contains deficiency, (c) controlling a volume of logic description contained in partial RTL description data (132) to be next created, based on the error-judgment data (137), and (d) outputting partial RTL description data (132) causing the same deficiency as deficiency of the input RTL description data (131), and having a minimum volume of logic description.

In yet another aspect of the present invention, there is provided an apparatus for creating partial RTL description data (135), including a data reader (171) which stores external-terminal data (141) into a signal-data table (133), the external-terminal data (141) including a name of a signal of an external terminal of the input RTL description data (131), and a direction of the signal, an internal logic-description extractor (172) which creates intermediate RTL description data (134) including logic description extracted from successive portions of the input RTL description data (131), a signal-data table creator (173) which creates definition/reference data (142) and stores the definition/reference data (142) into the signal-data table (133), the definition/reference data (142) being indicative of whether each of signals in the intermediate RTL description data (134) is defined and referred to either in the intermediate RTL description data (134) or outside the intermediate RTL description data (134), an external-terminal data creator (174) which judges a category of each of signals in the intermediate RTL description data (134) is an output terminal, an input terminal or an internal signal in the intermediate RTL description data (134), based on the external-terminal data (141) and the definition/reference data (142) both stored in the signal-data table (133), and stores the judgment results into the signal-data table (133) as category data (143), and a RTL creator (175) which creates data relating to an external terminal, based on the category data (143) stored in the signal-data table (133), and adds the external-terminal data (141) to the intermediate RTL description data (134) to create partial RTL description data (135) having possibility of causing the same deficiency as that of the input RTL description data (131).

The apparatus may further include a memory (114, 115) into which the internal logic-description extractor (172) stores the intermediate RTL description data (134) and further the RTL creator (175) stores the partial RTL description data (135).

The apparatus may further include a first memory (114) into which the internal logic-description extractor (172) stores the intermediate RTL description data (134), and a second memory (115) into which the RTL creator (175) stores the partial RTL description data (135).

In further aspect of the present invention, there is provided a method of creating partial RTL description data (135), including (a) storing external-terminal data (141) into a signal-data table (133), the external-terminal data (141) including a name of a signal of an external terminal of the input RTL description data (131), and a direction of the signal, (b) creating intermediate RTL description data (134) including logic description extracted from successive portions of the input RTL description data (131), (c) creating definition/reference data (142) and storing the definition/reference data (142) into the signal-data table (133), the definition/reference data (142) being indicative of whether each of signals in the intermediate RTL description data (134) is defined and referred to either in the intermediate RTL description data (134) or outside the intermediate RTL description data (134), (d) judging a category of each of signals in the intermediate RTL description data (134) is an output terminal, an input terminal or an internal signal in the intermediate RTL description data (134), based on the external-terminal data (141) and the definition/reference data (142) both stored in the signal-data table (133), (e) storing the judgment results into the signal-data table (133) as category data (143), (f) creating data relating to an external terminal, based on the category data (143) stored in the signal-data table (133), and (g) adding the external-terminal data (141) to the intermediate RTL description data (134) to create partial RTL description data (135).

In further aspect of the present invention, there is provided a program for causing a computer to act as an apparatus for creating partial RTL description data (135), the apparatus including a data reader (171) which stores external-terminal data (141) into a signal-data table (133), the external-terminal data (141) including a name of a signal of an external terminal of the input RTL description data (131), and a direction of the signal, an internal logic-description extractor (172) which creates intermediate RTL description data (134) including logic description extracted from successive portions of the input RTL description data (131), a signal-data table creator (173) which creates definition/reference data (142) and stores the definition/reference data (142) into the signal-data table (133), the definition/reference data (142) being indicative of whether each of signals in the intermediate RTL description data (134) is defined and referred to either in the intermediate RTL description data (134) or outside the intermediate RTL description data (134), an external-terminal data creator (174) which judges a category of each of signals in the intermediate RTL description data (134) is an output terminal, an input terminal or an internal signal in the intermediate RTL description data (134), based on the external-terminal data (141) and the definition/reference data (142) both stored in the signal-data table (133), and stores the judgment results into the signal-data table (133) as category data (143), and a RTL creator (175) which creates data relating to an external terminal, based on the category data (143) stored in the signal-data table (133), and adds the external-terminal data (141) to the intermediate RTL description data (134) to create partial RTL description data (135) having possibility of causing the same deficiency as that of the input RTL description data (131).

In further aspect of the present invention, there is provided a program for causing a computer to carry out a method of creating partial RTL description data (135), wherein steps executed by the computer in accordance with the program include (a) storing external-terminal data (141) into a signal-data table (133), the external-terminal data (141) including a name of a signal of an external terminal of the input RTL description data (131), and a direction of the signal, (b) creating intermediate RTL description data (134) including logic description extracted from successive portions of the input RTL description data (131), (c) creating definition/reference data (142) and storing the definition/reference data (142) into the signal-data table (133), the definition/reference data (142) being indicative of whether each of signals in the intermediate RTL description data (134) is defined and referred to either in the intermediate RTL description data (134) or outside the intermediate RTL description data (134), (d) judging a category of each of signals in the intermediate RTL description data (134) is an output terminal, an input terminal or an internal signal in the intermediate RTL description data (134), based on the external-terminal data (141) and the definition/reference data (142) both stored in the signal-data table (133), (e) storing the judgment results into the signal-data table (133) as category data (143), (f) creating data relating to an external terminal, based on the category data (143) stored in the signal-data table (133), and (g) adding the external-terminal data (141) to the intermediate RTL description data (134) to create partial RTL description data (135).

The advantages obtained by the aforementioned present invention will be described hereinbelow.

As mentioned earlier, if there occurred deficiency such as an error with unknown causes when a RTL-input program is executed with input RTL description data being input as input data, it took much time to identify the causes in the conventional apparatuses and methods. The present invention makes it possible to shorten a period of time necessary for identifying causes, because partial RTL description data having a minimum volume of logic description and causing the deficiency can be automatically created based on the input RTL description data, and hence, it is possible to identify causes by virtue of the thus created partial RTL description data in place of input RTL description data.

Furthermore, the present invention makes it possible, even if a RTL-input program causing deficiency is provided from a vendor, and RTL description data has to be provided to the vendor in order to reproduce an error and identify the causes, to provide partial RTL description data to the vendor in place of input RTL description data. Accordingly, it is no longer necessary to provide actual data to other persons, ensuring security on data.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 6A illustrates logical expressions expressing operation of the internal logic-description extractor and the external-terminal data creator in the apparatus in accordance with the first embodiment of the present invention.

FIG. 6B illustrates logical expressions expressing operation of the internal logic-description extractor and the external-terminal data creator in the apparatus in accordance with the first embodiment of the present invention.

FIG. 7 illustrates logical expressions expressing operation of the internal logic-description extractor and the external-terminal data creator in the apparatus in accordance with the first embodiment of the present invention.

DESCRIPTION OF THE PREFERRED EMBODIMENTS

Preferred embodiments in accordance with the present invention will be explained hereinbelow with reference to drawings.

Figure 1:
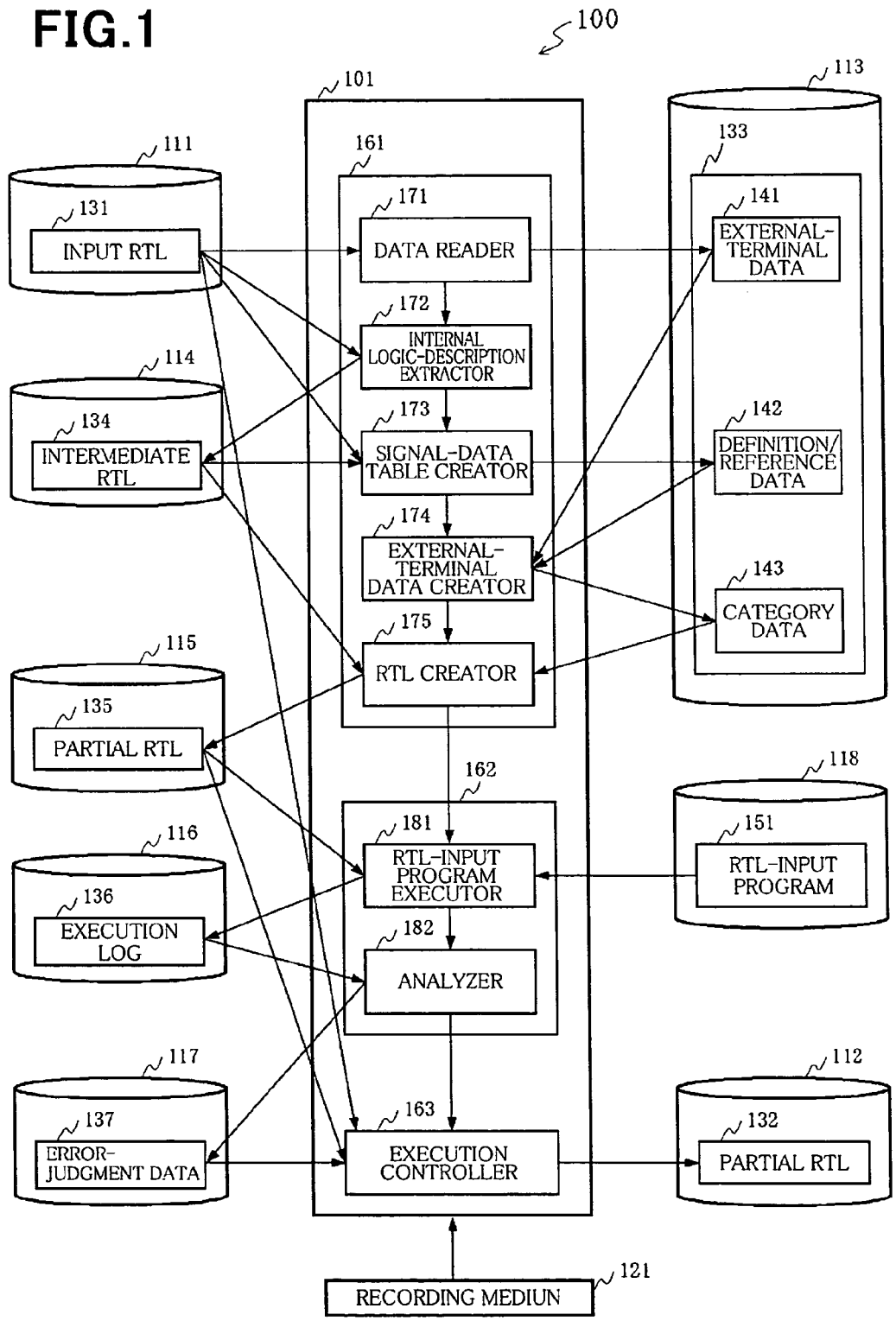
FIG. 1 is a block diagram of an apparatus for giving assistance in analyzing deficiency in a RTL-input program, in accordance with the first embodiment of the present invention.

FIG. 1 is a block diagram of an apparatus 100 for giving assistance in analyzing deficiency in a RTL-input program, in accordance with the first embodiment of the present invention.

As illustrated in FIG. 1, the apparatus 100 is comprised of a main processor 101 and first to eighth memories 111 to 118.

As illustrated in FIG. 1, a recording medium 121 such as a floppy disc is insertable into the main processor 101.

The first memory stores input RTL 131 therein. The input RTL comprises RTL description data which, when input into a certain RTL-input program, causes an error with unknown causes in the RTL-input program.

The second memory 112 stores therein partial RTL 132 created by the main processor 101 to process the input RTL 131. The partial RTL 132 comprises minimum RTL description data which causes the same deficiency as the deficiency caused by the input RTL 131. Herein, "minimum RTL description data" means RTL description data having a minimum number of logic description sentences.

The third to seventh memories 113 to 117 store data created in steps wherein the main processor 101 fabricates the partial RTL 132 from the input RTL 131.

Specifically, the third memory 113 stores a signal-data table 133 therein.

The fourth memory 114 stores intermediate RTL 134 therein.

The fifth memory 115 stores partial RTL 135 therein.

The sixth memory 116 stores an execution log 136 therein.

The seventh memory 117 stores error-judgment data 137 therein.

The eighth memory 118 stores a RTL-input program 151 which abnormally ends, if the RTL-input program 151 is made execute with the input RTL 131 being input thereinto.

As illustrated in FIG. 1, the main processor 101 includes a partial RTL creator 161, an estimator 162, and an execution controller 163.

The partial RTL creator 161 receives the input RTL 131 as input data from the first memory 111, and processes the input RTL 131 to create the partial RTL 135. The partial RTL creator 161 stores the thus created partial RTL 135 into the fifth memory 115. The partial RTL 135 comprises RTL description data includes the same logic description as a part of the input RTL 131, and has connection relation or correspondence in signals in the input RTL 131. The partial RTL 135 further includes data relating to an external terminal.

The partial RTL creator 161 comprises a data reader 171, an internal logic-description extractor 172, a signal-data table creator 173, an external-terminal data creator 174, and a RTL creator 175.

The data reader 171 reads the input RTL 131 out of the first memory 111, and analyzes the input RTL 131 to thereby store external-terminal data 141 into a signal-data table 133 included in the third memory 113. The external-terminal data 141 includes a name and a direction of a signal of an external terminal of the input RTL 131.

The internal logic-description extractor 172 reads the input RTL 131 out of the first memory 111, and extracts a part of logic description of the input RTL 131 out of the input RTL 131 without any changes to thereby create intermediate RTL 134 comprised only of the logic description extracted from the input RTL 131. The thus created intermediate RTL 134 is stored into the fourth memory 114.

The signal-data table creator 173 reads the intermediate RTL 134 out of the fourth memory 114, and further reads the input RTL 131 out of the first memory 111. Then, signal-data table creator 173 creates definition/reference data 142 and stores the definition/reference data 142 into the signal-data table 133. The definition/reference data 142 is indicative of whether each of signals in the intermediate RTL 134 is defined and referred to either in the intermediate RTL 134 or outside the intermediate RTL 134.

The external-terminal data creator 174 reads the external-terminal data 141 and the definition/reference data 142 out of the signal-data table 133, and judges a category of each of signals in the intermediate RTL 134 is an output terminal, an input terminal or an internal signal of the intermediate RTL 134, based on the external-terminal data and the definition/reference data. The external-terminal data creator 174 stores the judgment results into the signal-data table 133 as category data 143.

The RTL creator 175 reads the intermediate RTL 134 out of the fourth memory 114, and further, reads the category data 143 of each of signals in the intermediate RTL 134 out of the signal-data table 133. The RTL creator 175 adds external-terminal data created based on the category data 143 to the intermediate RTL 134 to create partial RTL 135. The partial RTL 135 is stored into the fifth memory 115.

The estimator 162 reads the partial RTL 135 out of the fifth memory 115, and further, reads the RTL-input program 151 out of the eighth memory 118. The estimator 162 executes the RTL-input program 151 on receipt of the partial RTL 135 as input data to create error-judgment data 137 indicative of whether the RTL-input program 151 abnormally ends due to program errors with unknown causes. The error-judgment data 137 is stored into the seventh memory 117.

The estimator 162 comprises a RTL-input program executor 181, and an analyzer 182.

The RTL-input program executor 181 reads the partial RTL 135 out of the fifth memory 115, and further, reads the RTL-input program 151 out of the eighth memory 118. Then, the RTL-input program executor 181 executes the RTL-input program 151 with the partial RTL 135 being input, and creates an execution log 136. The execution log 136 is stored into the sixth memory 116.

The analyzer 182 reads the execution log 136 out of the sixth memory 116 and analyzes the execution log 136 to create the error-judgment data 137 indicative of whether the RTL-input program 151 abnormally ends due to an internal error with unknown causes. The error-judgment data 137 is stored into the seventh memory 117.

The execution controller 163 controls a volume of logic description contained in the partial RTL 135 to be next created by the partial RTL creator 161, based on a number of logic description sentences contained in the input RTL 131 stored in the first memory 111, and the judgment results indicated by the error-judgment data 137 stored in the seventh memory 117. The execution controller 163 further determines the partial RTL 132 causing the same deficiency as deficiency of the input RTL 131, and comprising minimum RTL description data. The thus determined partial RTL 132 is stored into the second memory 112.

The apparatus 100 having the above-mentioned structure can be accomplished by a computer such as a personal computer or a workstation, and a program to be executed by the computer. The program is stored in the recording medium readable by a computer, such as a magnetic disc, and is read into a computer comprising the main processor 101. The program controls operation of the computer to accomplish the partial RTL creator 161, the estimator 162 and the execution controller 163 in the computer. That is, the apparatus 100 operates in accordance with the program provided through the recording medium 121. The first to eighth memories 111 to 118 may be comprised of memories such as a main storage and external storages equipped in the computer.

Figure 2:
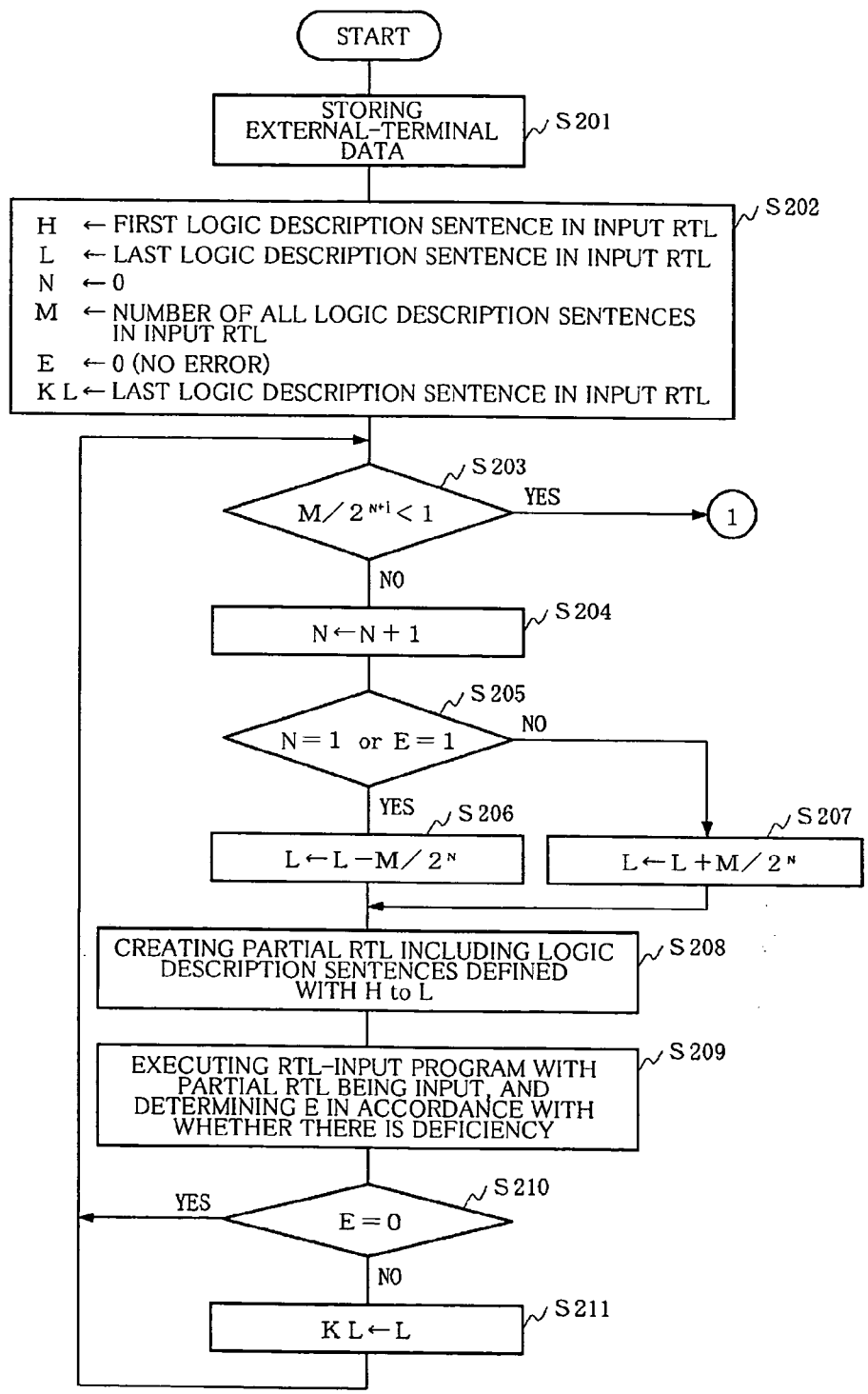
FIG. 2 is a flow chart showing steps to be carried out by the main processor in the apparatus in accordance with the first embodiment of the present invention.
Figure 3:
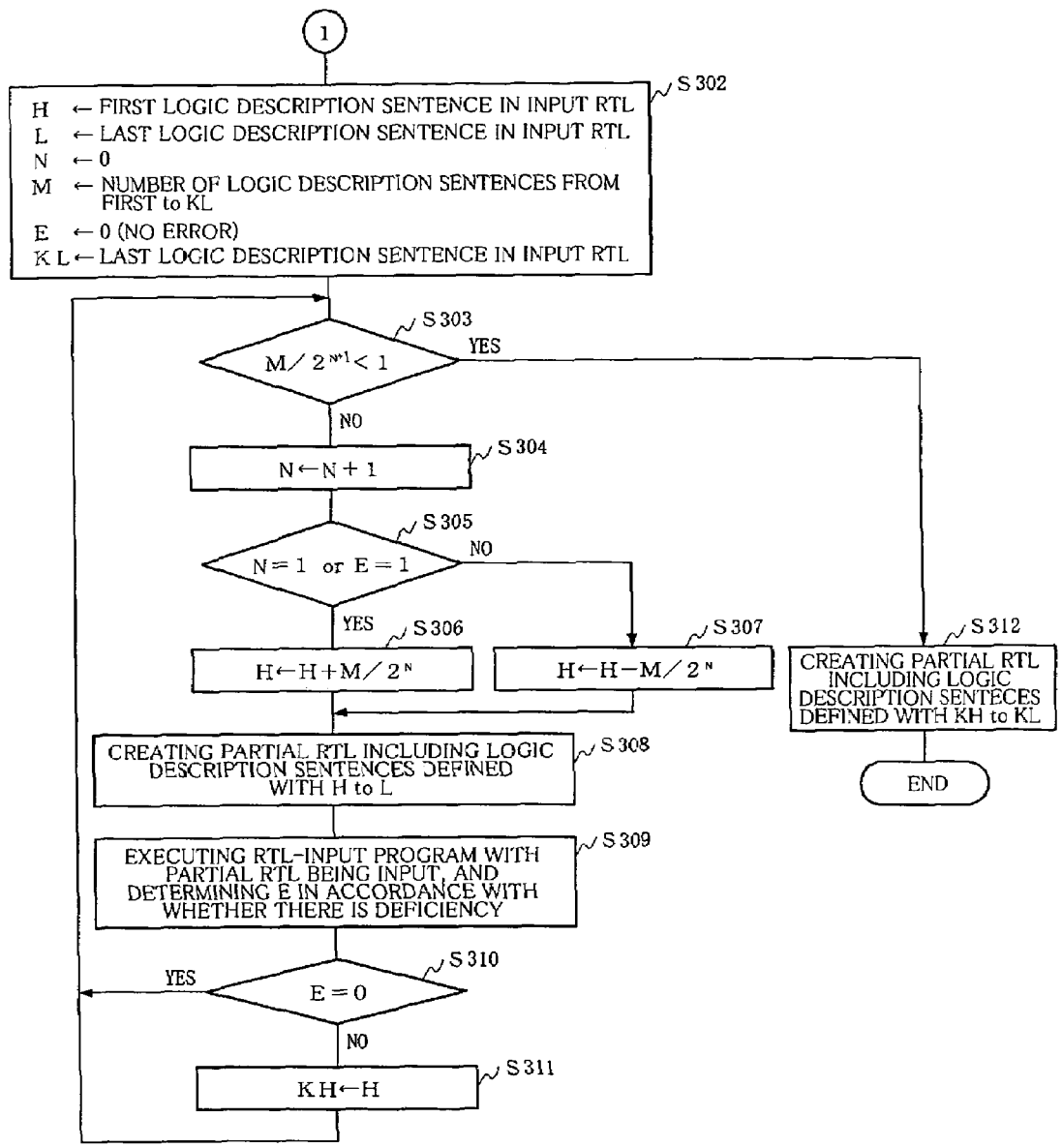
FIG. 3 is a flow chart showing steps to be carried out by the main processor in the apparatus in accordance with the first embodiment of the present invention.

Each of FIGS. 2 and 3 is a flow chart showing steps to be carried out by the main processor 101.

Hereinbelow is explained operation of the apparatus 100 in accordance with the first embodiment, with reference to FIGS. 2 and 3.

After the main processor 101 has started up, the main processor 101 causes the data reader 171 of the partial RTL creator 161 to create the external-terminal data 141 including a name and a direction of an external terminal signal included in the input RTL 131. Herein, a direction of an external terminal signal indicates "input" or "output". Then, the data reader 171 stores the external-terminal data 141 to the signal-data table 133, in step S201.

Herein, it is assumed that the partial RTL including first to K-th logic description sentences among a plurality of logic description sentences input in the input RTL 131 causes the same deficiency as deficiency of input RTL 131 which would cause the RTL-input program to abnormally end.

The execution controller 163 tries to find "K" defined as above. In order to find "K", the partial RTL creator 161 creates a plurality of partial RTLs each having a fixed upper limit defined with a first logic description sentence and a variable lower limit defined with a certain logic description sentence other than the first logic description sentence. Then, the estimator 162 actually inputs each of the partial RTLs into the RTL-input program 151 to check whether there is deficiency, that is, the RTL-input program 151 abnormally ends. The estimator 162 repeatedly carries out the checking (steps S202 to S211).

Specifically, the following steps are carried out.

First, the execution controller 163 initializes variables in step S202.

Specifically, a first logic description sentence in the input RTL 131 is set as a variable H indicative of an upper limit, and a last logic description sentence in the input RTL 131 is set as a variable L indicative of a lower limit.

A variable N indicative of a repetition number is reset to zero (0). A variable M indicative of a number of logic description sentences to be processed is set equal to a number of all logic description sentences in the input RTL 131. A variable E indicative of whether the error-judgment data 137 indicates that there is an error is set equal to zero (0) indicating that there is no error. A last logic description sentence in the input RTL 131 is stored as an initial variable KL indicative of a determined lower limit Then, the execution controller 163 checks whether the condition ($M/2^{(N+1)}<1$) by which the step of determining a lower limit ends is satisfied, in step S203.

At this stage, the condition is not yet satisfied (NO in step S203). Accordingly, the execution controller 163 adds one (1) to the variable N, in step S204.

Then, the execution controller 163 checks whether the variable N is equal to one (1) or the variable E is equal to one (1), in step S205.

Since the variable N was reset into zero (0), the variable N became equal to one (1) by adding one (1) into the variable N in step S204 (YES in step S205).

Accordingly, the variable L indicative of a lower limit is shifted upwardly by $M/2^1$ from the current position, in step S206. That is, a lower limit is now set at a middle of the logic description sentences included in the input RTL 131.

Then, the internal logic-description extractor 172 of the partial RTL creator 161 extracts logic description sentences out of the input RTL 131 as the intermediate RTL 134, starting from an initial logic description sentence indicated by the variable H and terminating at a logic description sentence indicated by the variable L and disposed at a middle of the logic description sentences included in the input RTL 131.

Then, the signal-data table creator 173 creates the definition/reference data 142 for each of signals included in the intermediate RTL 134, the external-terminal data creator 174 creates the category data 143 indicative of a category of each of signals included in the intermediate RTL 134, and the RTL creator 175 creates the partial RTL 135 by adding external-terminal data created based on the category data 143, to the intermediate RTL 134, in step S208.

Then, the RTL-input program executor 181 of the estimator 162 executes the RTL-input program 151 with the partial RTL 135 being input thereinto, to thereby have the execution log 136. The execution log 136 is stored into the sixth memory 116.

The analyzer 182 reads the execution log 136 out of the sixth memory 116 or receives the execution log 136 from the RTL-input program executor 181, and analyzes the execution log 136 to create the error-judgment data 137 indicating whether the RTL-input program 151 has abnormally ended due to an internal error with unknown causes.

The execution controller 163 sets the variable E equal to one (1) indicative of occurrence of an error, if the error occurred, or sets the variable E equal to zero (0) indicative of no errors, if the error did not occur, in accordance with the error-judgment data 137, in step S209.

Then, the execution controller 163 checks whether the variable E is equal to zero (0), in step S210.

If the variable E is equal to one (1) (NO in step S210), the execution controller 163 puts the logic description sentence indicated by the current variable L, into the variable KL to update a determined lower limit, in step S211.

Then, the execution controller 163 checks again whether the condition ($M/2^{(N+1)}<1$) by which the step of determining a lower limit ends is satisfied, in step S203. If the condition is not satisfied (NO in step S203), the above-mentioned steps S204 to S211 are repeatedly carried out.

If the previously created partial RTL 135 including the first logic description sentence to a logic description sentence disposed at a middle of all logic description sentences is accompanied with an error such as abnormally ending, and accordingly, the variable E is set equal to one (1) (YES in step S205), the variable L indicative of a lower limit is upwardly shifted by $M/2^2$ from the current position (step S206), and hence, a partial RTL 135 smaller in size than the previous one is created and estimated.

In contrast, if an error did not occur, and hence, the variable E remains equal to zero (0) (NO in step S205), the variable L indicative of a lower limit is downwardly shifted by $M/2^2$ from the current position (step S207), and hence, a partial RTL 135 larger in size than the previous one is created and estimated.

The above-mentioned steps are repeatedly carried out until the condition ($M/2^{(N+1)}<1$) by which the step of determining a lower limit ends is satisfied. When the condition is satisfied, a lower limit stored in the variable KL at that time is finalized.

Determining a lower limit in accordance with the steps illustrated in FIG. 2, the execution controller 163 next determines an upper limit with the determined lower limit being fixed, as follows.

Herein, it is assumed that the partial RTL including S-th to K-th logic description sentences among a plurality of logic description sentences input in the input RTL 131 causes the same deficiency as deficiency of input RTL 131 which would cause the RTL-input program to abnormally end. Herein, S is an integer smaller than "K", but equal to or greater than one (1), and "K" indicates the finalized lower limit determined in accordance with the above-mentioned steps.

The execution controller 163 tries to find "S" defined as above. In order to find "S", the partial RTL creator 161 creates a plurality of partial RTLs each having a variable upper limit and a fixed lower limit defined with the variable KL. Then, the estimator 162 actually inputs each of the partial RTLs into the RTL-input program 151 to check whether there is deficiency, that is, the RTL-input program 151 abnormally ends. The estimator 162 repeatedly carries out the checking (steps S302 to S311).

Specifically, the following steps are carried out.

First, the execution controller 163 initializes variables in step S302.

Specifically, a first logic description sentence in the input RTL 131 is set as a variable H indicative of an upper limit, and a logic description sentence indicative of the finalized lower limit determined in accordance with the steps illustrated in FIG. 2 is set as a variable L indicative of a lower limit.

A variable N indicative of a repetition number is reset to zero (0). A variable M indicative of a number of logic description sentences to be processed is set equal to a number of logic description sentences starting from a first logic description sentence in the input RTL 131 to a logic description sentence defined with the finalized lower limit determined in accordance with the steps illustrated in FIG. 2. A variable E indicative of whether the error-judgment data 137 indicates that there is an error is set equal to zero (0) indicating that there is no error. A first logic description sentence in the input RTL 131 is stored as an initial variable KL indicative of a determined lower limit.

Then, the execution controller 163 checks whether the condition ($M/2^{(N+1)}<1$) by which the step of determining an upper limit ends is satisfied, in step S303.

At this stage, the condition is not yet satisfied (NO in step S303). Accordingly, the execution controller 163 adds one (1) to the variable N, in step S304.

Then, the execution controller 163 checks whether the variable N is equal to one (1) or the variable E is equal to one (1), in step S305.

Since the variable N was reset into zero (0), the variable N became equal to one (1) by adding one (1) into the variable N in step S304 (YES in step S305).

Accordingly, the variable H indicative of an upper limit is shifted downwardly by $M/2^1$ from the current position, in step S306. That is, an upper limit is now set at a middle of the logic description sentences starting from a first logic description sentence in the input RTL 131 to a logic description sentence defined with the finalized lower limit determined in accordance with the steps illustrated in FIG. 2.

Then, the internal logic-description extractor 172 of the partial RTL creator 161 extracts logic description sentences out of the input RTL 131 as the intermediate RTL 134, starting from an initial logic description sentence indicated by the variable H and terminating at a logic description sentence indicated by the variable L as the finalized lower limit.

Then, the signal-data table creator 173 creates the definition/reference data 142 for each of signals included in the intermediate RTL 134, the external-terminal data creator 174 creates the category data 143 indicative of a category of each of signals included in the intermediate RTL 134, and the RTL creator 175 creates the partial RTL 135 by adding external-terminal data created based on the category data 143, to the intermediate RTL 134, in step S308.

Then, the RTL-input program executor 181 of the estimator 162 executes the RTL-input program 151 with the partial RTL 135 being input thereinto, to thereby have the execution log 136. The execution log 136 is stored into the sixth memory 116.

The analyzer 182 reads the execution log 136 out of the sixth memory 116 or receives the execution log 136 from the RTL-input program executor 181, and analyzes the execution log 136 to create the error-judgment data 137 indicating whether the RTL-input program 151 has abnormally ended due to an internal error with unknown causes.

The execution controller 163 sets the variable E equal to one (1) indicative of occurrence of an error, if the error occurred, or sets the variable E equal to zero (0) indicative of no errors, if the error did not occur, in accordance with the error-judgment data 137, in step S309.

Then, the execution controller 163 checks whether the variable E is equal to zero (0), in step S310.

If the variable E is equal to one (1) (NO in step S310), the execution controller 163 puts the logic description sentence indicated by the current variable H, into the variable KH to update a determined upper limit, in step S311.

Then, the execution controller 163 checks again whether the condition ($M/2^{(N+1)}<1$) by which the step of determining an upper limit ends is satisfied, in step S303. If the condition is not satisfied (NO in step S303), the above-mentioned steps S304 to S311 are repeatedly carried out.

If the previously created partial RTL 135 is accompanied with an error such as abnormally ending, and accordingly, the variable E is set equal to one (1) (YES in step S305), the variable H indicative of an upper limit is downwardly shifted by $M/2^2$ from the current position (step S306), and hence, a partial RTL 135 smaller in size than the previous one is created and estimated.

In contrast, if an error did not occur, and hence, the variable E remains equal to zero (0) (NO in step S305), the variable H indicative of an upper limit is upwardly shifted by $M/2^2$ from the current position (step S307), and hence, a partial RTL 135 larger in size than the previous one is created and estimated.

If the condition ($M/2^{(N+1)}<1$) by which the step of determining an upper limit ends is satisfied (YES in step S303), an upper limit stored in the variable KH at that time is finalized, that is, determined as a final upper limit.

The execution controller 163 creates the partial RTL 132 including logic description sentences starting from the logic description sentence indicated by the variable KH as the finalized upper limit and terminating at the logic description sentence indicated by the variable KL as the finalized lower limit, and stores the thus created partial RTL 132 into the second memory 112, in step S312.

If such a partial RTL 132 as mentioned above has been already created in step S309, it is not necessary to create the partial RTL 132 again in step S312.

If there occurred deficiency when the RTL-input program 151 is executed with the input RTL 131 being input thereinto, it took much time to identify causes in the conventional apparatuses and methods. The above-mentioned first embodiment makes it possible to shorten time necessary for identifying causes, because the main processor 101 can automatically create the partial RTL 132 having a minimum volume of logic description and causing the same deficiency as the deficiency accompanied with the RTL-input program 151.

Furthermore, the first embodiment makes it possible, even if the RTL-input program 151 causing deficiency is provided from a vendor, and RTL description data has to be provided to the vendor in order to reproduce an error and identify causes, to provide the partial RTL 132 to the vendor in place of the input RTL 131. Accordingly, it is no longer necessary to provide actual data to other persons, enhancing security on data.

Figure 4:
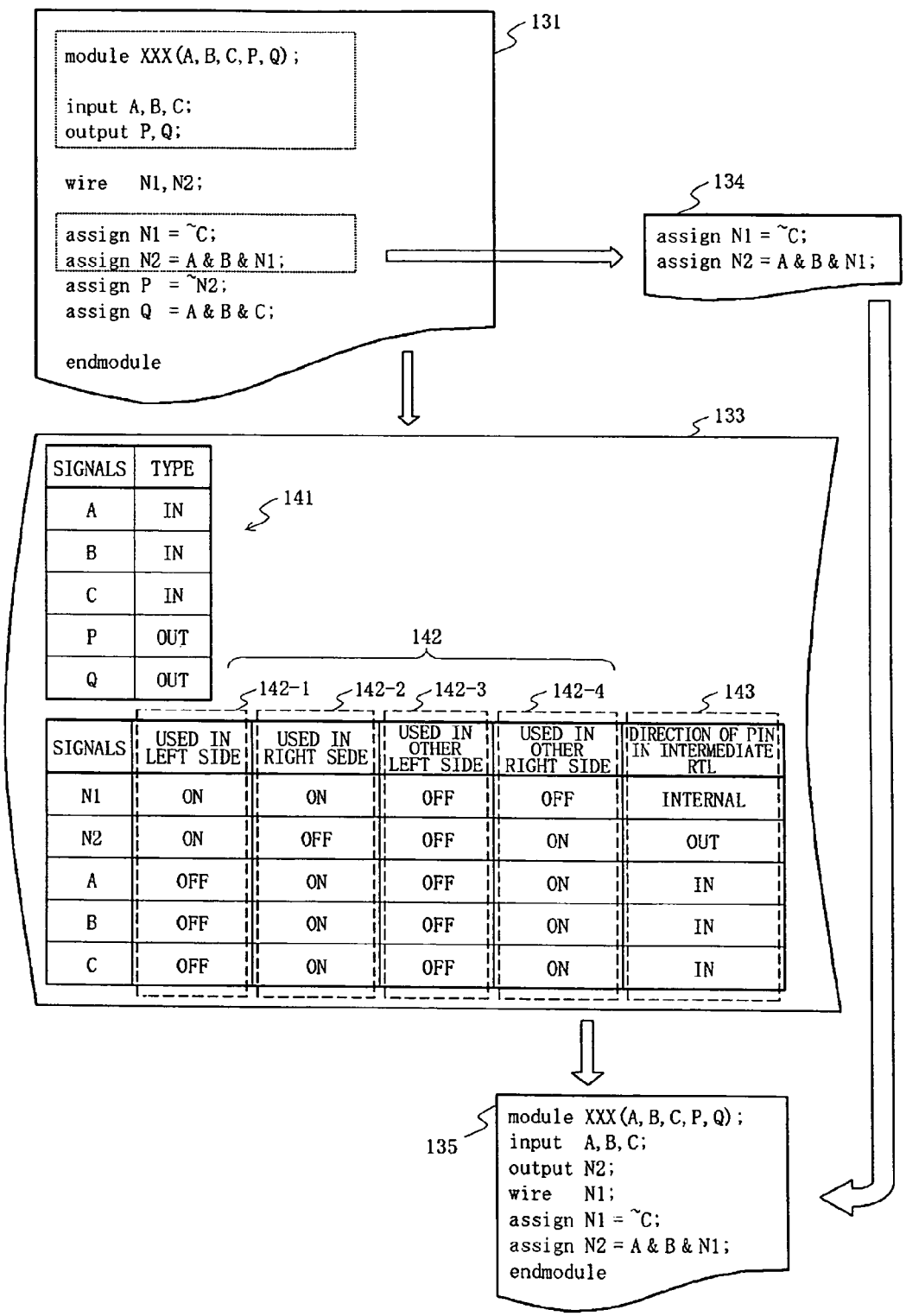
FIG. 4 illustrates an example of an input RTL, a signal-data table and a partial RTL.
Figure 5:
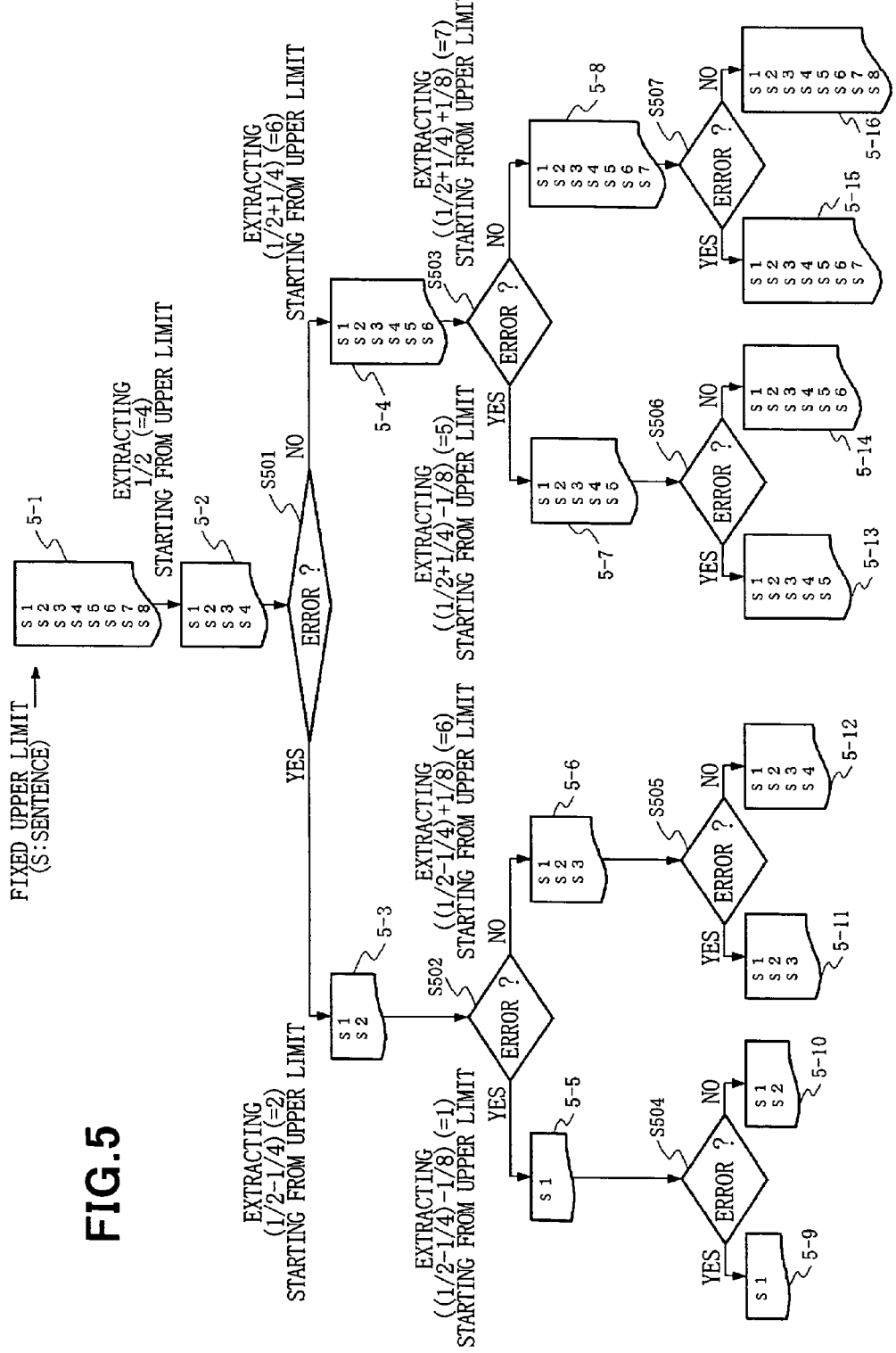
FIG. 5 is a flow chart showing steps to be carried out for determining a final lower limit.

FIG. 4 illustrates an example of the input RTL 131, the signal-data table 133 and the partial RTL 135. FIG. 5 is a flow chart showing steps to be carried out for determining a final lower limit. Each of FIGS. 6A and 6B illustrates logical expressions expressing operation of the internal logic-description extractor 172 and the external-terminal data creator 174. FIG. 7 illustrates logical expressions expressing operation of the internal logic-description extractor 172 and the external-terminal data creator 174.

Hereinbelow is explained an example of the operation of the apparatus 100 in accordance with the above-mentioned first embodiment, with reference to FIGS. 1 to 3 and FIGS. 4 to 7.

As mentioned earlier, the data reader 171 of the partial RTL creator 161 stores the external-terminal data 141 into the signal-data table 133. The external-terminal data 141 includes a name and a direction of an external terminal signal included in the input RTL 131. This is explained with reference to FIG. 4.

Signals A, B and C indicated as "input" in the input RTL 131 are stored in the signal-data table 133 as the external-terminal data 141 so as to have "IN" in the column "TYPE". Similarly, signals P and Q indicated as "output" in the input RTL 131 are stored in the signal-data table 133 as the external-terminal data 141 so as to have "OUT" in the column "TYPE".

The internal logic-description extractor 172 of the partial RTL creator 161 extracts a part of logic description sentences, as follows.

First, a first logic description sentence in the input RTL 131 is fixed as an upper limit in a range out of which a partial RTL is to be extracted, and a last logic description sentence in the input RTL 131 is temporarily set as an initial lower limit in the range.

Then, a part of logic description sentences is extracted out of the input RTL 131 in accordance with the logical expression shown in FIG. 6A. In FIG. 6A, "M" indicates a number of all logic description sentences in the input RTL 131.

After a lower limit has been determined, the determined lower limit is fixed as a lower limit, and a first logic description sentence in the input RTL 131 is temporarily set as an upper limit. Then, a part of logic description sentences is extracted out of the input RTL 131 in accordance with the logical expression shown in FIG. 6B. In FIG. 6B, "M" indicates a number of logic description sentences starting from a first logic description sentence to a logic description sentence defined with the determined lower limit in the input RTL 131.

The intermediate RTL 134 illustrated in FIG. 4 is created by the internal logic-description extractor 172 out of the input RTL 131 in accordance with the first flow.

Hereinbelow is explained an operation of the internal logic-description extractor 172 with reference to FIG. 5.

In the first flow, the internal logic-description extractor 172 creates a partial RTL 5-2 including logic description sentences starting from an upper limit defined with a first logic description sentence in input RTL 5-1 and terminating at a middle ($1/2$) of all logic description sentences in the input RTL 5-1.

For instance, if the input RTL 5-1 includes eight logic description sentences, the partial RTL 5-2 includes first to fourth logic description sentences, as illustrated in FIG. 5.

In the second flow, the analyzer 182 checks whether an error is detected in the first flow, in step S501.

If the analyzer 182 detects an error in the first flow (YES in step S501), the internal logic-description extractor 172 creates a partial RTL 5-3 having an upper limit defined with a first logic description sentence in input RTL 5-1 and a lower limit defined with a logic description sentence located at ($1/2-1/4$). Specifically, the internal logic-description extractor 172 creates the partial RTL 5-3 including first to second logic description sentences, as illustrated in FIG. 5 ($1/2-1/4=1/4$, $1/4\times8=2$).

If the analyzer 182 does not detect an error in the first flow (NO in step S501), the internal logic-description extractor 172 creates a partial RTL 5-4 having an upper limit defined with a first logic description sentence in input RTL 5-1 and a lower limit defined with a logic description sentence located at ($1/2+1/4$). Specifically, the internal logic-description extractor 172 creates the partial RTL 5-4 including first to sixth logic description sentences, as illustrated in FIG. 5 ($1/2+1/4=3/4$, $3/4\times8=6$).

In the third flow, after the partial RTL 5-3 has been created, the analyzer 182 checks whether an error is detected in the second flow, in step S502.

If the analyzer 182 detects an error in both of the first and second flows (YES in step S502), the internal logic-description extractor 172 creates a partial RTL 5-5 having an upper limit defined with a first logic description sentence in input RTL 5-1 and a lower limit defined with a logic description sentence located at (($1/2-1/4$)−$1/8$). Specifically, the internal logic-description extractor 172 creates the partial RTL 5-5 including only a first logic description sentence, as illustrated in FIG. 5 (($1/2-1/4$)−$1/8=1/8$, $1/8\times8=1$).

If the analyzer 182 detected an error in the first flow, but does not detect an error in the second flow (NO in step S502), the internal logic-description extractor 172 creates a partial RTL 5-6 having an upper limit defined with a first logic description sentence in input RTL 5-1 and a lower limit defined with a logic description sentence located at (($1/2-1/4$)+$1/8$). Specifically, the internal logic-description extractor 172 creates the partial RTL 5-6 including first to third logic description sentences, as illustrated in FIG. 5 (($1/2-1/4$)+$1/8=3/8$, $3/8\times8=3$).

In the third flow, after the partial RTL 5-4 has been created, the analyzer 182 checks whether an error is detected in the second flow, in step S503.

If the analyzer 182 did not detect an error in the first flow, but detects an error in the second flow (YES in step S503), the internal logic-description extractor 172 creates a partial RTL 5-7 having an upper limit defined with a first logic description sentence in input RTL 5-1 and a lower limit defined with a logic description sentence located at (($1/2+1/4$)−$1/8$). Specifically, the internal logic-description extractor 172 creates the partial RTL 5-7 including first to fifth logic description sentences, as illustrated in FIG. 5 (($1/2+1/4$)−$1/8=5/8$, $5/8\times8=5$).

If the analyzer 182 does not detect an error in both of the first and second flows (NO in step S503), the internal logic-description extractor 172 creates a partial RTL 5-8 having an upper limit defined with a first logic description sentence in input RTL 5-1 and a lower limit defined with a logic description sentence located at (($1/2+1/4$)+$1/8$). Specifically, the internal logic-description extractor 172 creates the partial RTL 5-8 including first to seventh logic description sentences, as illustrated in FIG. 5 (($1/2+1/4$)+$1/8=7/8$, $7/8\times8=7$).

In the fourth flow, after the partial RTLs 5-5, 5-6, 5-7 and 5-8 have been created, the analyzer 182 checks whether an error is detected in the third flow; in steps S504, S505, S506 and S507, respectively.

If the analyzer 182 detects an error in the third flow (YES in step S504), the internal logic-description extractor 172 creates a partial RTL 5-9 having the same logic description sentences as those of the partial RTL 5-5. Specifically, the internal logic-description extractor 172 creates the partial RTL 5-9 including only first logic description sentence.

If the analyzer 182 does not detect an error in the third flow (NO in step S504), the internal logic-description extractor 172 creates a partial RTL 5-10 having an upper limit defined with a first logic description sentence in the input RTL 5-1 and a lower limit defined with a logic description sentence next to a last logic description sentence in the partial RTL 5-5. Specifically, the internal logic-description extractor 172 creates the partial RTL 5-10 including first to second logic description sentences.

If the analyzer 182 detects an error in the third flow (YES in step S505), the internal logic-description extractor 172 creates a partial RTL 5-11 having the same logic description sentences as those of the partial RTL 5-6. Specifically, the internal logic-description extractor 172 creates the partial RTL 5-11 including first to third logic description sentences.

If the analyzer 182 does not detect an error in the third flow (NO in step S505), the internal logic-description extractor 172 creates a partial RTL 5-12 having an upper limit defined with a first logic description sentence in the input RTL 5-1 and a lower limit defined with a logic description sentence next to a last logic description sentence in the partial RTL 5-6. Specifically, the internal logic-description extractor 172 creates the partial RTL 5-12 including first to fourth logic description sentences.

If the analyzer 182 detects an error in the third flow (YES in step S506), the internal logic-description extractor 172 creates a partial RTL 5-13 having the same logic description sentences as those of the partial RTL 5-7. Specifically, the internal logic-description extractor 172 creates the partial RTL 5-13 including first to fifth logic description sentences.

If the analyzer 182 does not detect an error in the third flow (NO in step S506), the internal logic-description extractor 172 creates a partial RTL 5-14 having an upper limit defined with a first logic description sentence in the input RTL 5-1 and a lower limit defined with a logic description sentence next to a last logic description sentence in the partial RTL 5-7. Specifically, the internal logic-description extractor 172 creates the partial RTL 5-14 including first to sixth logic description sentences.

If the analyzer 182 detects an error in the third flow (YES in step S507), the internal logic-description extractor 172 creates a partial RTL 5-15 having the same logic description sentences as those of the partial RTL 5-8. Specifically, the internal logic-description extractor 172 creates the partial RTL 5-15 including first to seventh logic description sentences.

If the analyzer 182 does not detect an error in the third flow (NO in step S507), the internal logic-description extractor 172 creates a partial RTL 5-16 having an upper limit defined with a first logic description sentence in the input RTL 5-1 and a lower limit defined with a logic description sentence next to a last logic description sentence in the partial RTL 5-8. Specifically, the internal logic-description extractor 172 creates the partial RTL 5-16 including first to eighth logic description sentences.

The signal-data table creator 173 stores the definition/reference data 142 into the signal-data table 133. The definition/reference data 142 includes data indicating whether each of signals in the intermediate RTL 134 extracted by the internal logic-description extractor 172 is written in right and/or left sides in the logical expression stored in the intermediate RTL 134, and data indicating whether the each of signals is written in right and/or left sides in other logical expressions in the extracted intermediate RTL 134.

This step is explained hereinbelow with reference to FIG. 4.

Among signals N1, N2, A, B and C in the intermediate RTL 134 created by the internal logic-description extractor 172 out of the in input RTL 131 in the first flow, since the signals N1 and N2 are used in a left side of the intermediate RTL 134, "ON" is stored into a table 142-1 for the signals N1 and N2, and "OFF" is stored into the table 142-1 for the signals A, B and C in a column "signals used in a left side".

Furthermore, since the signals N1, A, B and C are used in a right side of the intermediate RTL 134, "ON" is stored into a table 142-2 for the signals N1, A, B and C, and "OFF" is stored into the table 142-1 for the signal N2 in a column "signals used in a right side".

Then, among the signals N1, N2, A, B and C in the intermediate RTL 134, there is no signals used in a left side in other logical expressions in the intermediate RTL 134, "OFF" is stored into a table 142-3 for signals used in a left side in such a logical expression, that is, "OFF" is stored into the table 142-3 for the signals N1, N2, A, B and C in a column "signals used in other left side".

Since the signals N2, A, B and C are used in a right side in other logical expressions in the intermediate RTL 134, "ON" is stored into a table 142-4 for the signal N2, A, B and C, and "OFF" is stored into the table 142-4 for the signal N1 in a column "signals used in other right side"

The external-terminal data creator 174 determines the category data 143 for each of signals in the intermediate RTL 134, based on data stored in the signal-data table 133, in accordance with the logical expression illustrated in FIG. 7.

This step is explained with reference to FIG. 4.

As illustrated in FIG. 4, since the signals A, B and C are stored in the form of "used in right side"=ON and "TYPE of an external-terminal table"=IN, "IN" is stored as a direction of a pin. Since the signal N2 is stored in the form of "used in left side"=ON and "used in other right side"=ON, "OUT" is stored as an external output terminal of the intermediate RTL 134. Since the signal N1 is stored as not included in an external-terminal table and in the form of "used in left side"=ON, "used in other left and right sides"=OFF, "INTERNAL" is stored as a direction of a pin.

The RTL creator 175 creates an external terminal, based on the intermediate RTL 134 and the category data 143 (a direction of a pin in the intermediate RTL 134) stored in the signal-data table 133, to thereby create the partial RTL 135 in which the connection in signals in the input RTL 131 is maintained.

The partial RTL 135 illustrated in FIG. 4 is an example of a partial RTL 135 created based on the intermediate RTL 134 illustrated in FIG. 4, and the category data 143 stored in the signal-data table 133, indicative of a direction of a pin in the intermediate RTL 134. Data other than logic description, such as a module name of the partial RTL 135, are taken over from the input RTL 131 without any changes.

The RTL-input program executor 181 of the estimator 162 executes the RTL-input program 151 with the thus created partial RTL 135 being input thereinto, and creates the execution log 136. The execution log 136 is stored into the sixth memory 116.

The analyzer 182 analyzes the execution log 136 read out of the sixth memory 116 to thereby check whether there occurs deficiency.

The execution controller 163 determines a lower limit obtained when the condition ($M/2^{(N+1)} < 1$) is satisfied wherein M indicates a number of all logic description sentences in the input RTL 131, as a lower limit in a range out of which logic description sentence(s) is extracted out of the input RTL 131.

Specifically, a total number of logic description sentences in the input RTL 5-1 in FIG. 5 is eight (M=8). Accordingly, when N is three (3), the condition ($M/2^{(N+1)} < 1$) is satisfied ($8/2^{(3+1)} = 8/16 < 1$). Hence, the execution controller 163 sets a last logic description sentence in each of the partial RTLs 5-9 to 5-16 as a lower limit.

Then, the execution controller 163 fixes the thus obtained lower limit, and controls the steps illustrated in FIG. 3 to be carried out for determining an upper limit. When the condition ($M/2^{(N+1)} < 1$) is satisfied wherein M indicates a number of logic description sentences starting from a first logic description sentence to a logic description sentence defined with the fixed lower limit, the execution controller 163 determines the obtained partial RTL as a partial RTL having a minimum volume of logic description sentences and causing the same deficiency as the deficiency accompanied with the RTL-input program 151.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

In the above-mentioned first embodiment, the execution controller 163 first fixes an upper limit in a range out of which logic description sentences are extracted out of the input RTL 131, and sets a lower limit variable. Then, the execution controller 163 determines a partial RTL which includes logic description sentences starting from a first logic description sentence and terminating at a logic description sentence defined with the determined lower limit so as to have a minimum volume of logic description sentences, and causes the same deficiency as the deficiency accompanied with the RTL-input program 151. Then, the execution controller 163 fixes a lower limit at a last logic description sentence in the thus obtained partial RTL, and sets an upper limit variable. Then, the execution controller 163 determines a partial RTL which includes logic description sentences starting from a logic description sentence defined with the determined upper limit and terminating at a logic description sentence defined with the determined lower limit so as to have a minimum volume of logic description sentences, and causes the same deficiency as the deficiency accompanied with the RTL-input program 151.

In contrast, the execution controller 163 may first fix a lower limit and set an upper limit variable to determine a desired upper limit, in which case, after the upper limit has been finalized, the execution controller 163 fixes the upper limit and sets a lower limit variable to determine a desired lower limit.

The process of controlling a volume of logic description to be included in a partial RTL to be next created, that is, a range out of which the internal logic-description extractor 172 extracts next is not to be limited to the above-mentioned process in which processed logic description sentences are halved in comparison with the previously processed logic description sentences. For instance, a logic description sentence may be shifted one by one, though a yield is reduced.

In the above-mentioned first embodiment, the partial RTL creator 161, the estimator 162 and the execution controller 163 are accomplished in a single processor 101 comprising a computer. As an alternative, the partial RTL creator 161, the estimator 162 and the execution controller 163 may be accomplished in separate processors or computers.

In the above-mentioned first embodiment, the apparatus 100 is designed to include the first to eighth memories 111 to 118. As an alternative, the apparatus 100 may be designed to include seven or smaller memories. For instance, the apparatus 100 may be designed to include only one memory, in which case, the memory stores therein all what is stored in the first to eighth memories 111 to 118.

What is claimed is:

1. An apparatus for giving assistance in analyzing deficiency in a RTL-input program, comprising:
   a partial RTL creator which creates partial RTL description data containing logic description identical with logic description extracted from successive portions of input RTL description data, and having correspondence in signals identical with the same in said input RTL description data;
   an estimator which receives said partial RTL description data to execute a RTL-input program with the partial RTL description data and created to create an execution log to be analyzed, and error-judgment data indicative of whether said RTL-input program contains deficiency; and
   an execution controller which controls a volume of logic description contained in partial RTL description data to be next created by said partial RTL creator, based on said error-judgment data and on a number of logic description sentences contained in the input RTL description data, and outputs partial RTL description data causing the same deficiency as deficiency of said input RTL description data, and having a minimum volume of logic description,
   wherein said execution controller:
      fixates a first limit of a range in which logic description is to be extracted from said input RTL description data, at one of first and final logic description sentences of said input RTL description data, and sets a second limit of said range variable,
      determines partial RTL description data which includes logic description sentences starting from a logic description sentence disposed at said fixated first limit in said input RTL description data, causes the same deficiency as deficiency of said input RTL description data, and has a minimum volume of logic description,
      fixates said second limit at a logic description sentence disposed at a limit of the thus determined partial RTL description data, and sets said fixated first limit variable, and
      determines partial RTL description data which includes logic description sentences starting from a logic description sentence disposed at said fixated limit of said determined partial RTL description data, causes the same deficiency as deficiency of said input RTL description data, and has a minimum volume of logic description.

2. The apparatus as set forth in claim 1, further comprising a memory into which said partial RTL creator stores said partial RTL description data and further said estimator stores said error-judgment data.

3. The apparatus as set forth in claim 1, further comprising a first memory into which said partial RTL creator stores said partial RTL description data, and a second memory into which said estimator stores said error-judgment data.

4. The apparatus as set forth in claim 1, wherein said estimator comprises:
   a RTL-input program executor which, receiving said partial RTL description data as input data, executes a RTL-input program, and creates an execution log; and
   an analyzer which analyzes said execution log to create error-judgment data indicative of whether there is deficiency in said RTL-input program.

5. The apparatus as set forth in claim 4, further comprising a memory into which said RTL-input program executor stores said execution log and further said analyzer stores said error-judgment data.

6. The apparatus as set forth in claim 4, further comprising a first memory into which said RTL-input program executor stores said execution log, and a second memory into which said analyzer stores said error-judgment data.

7. A method of giving assistance in analyzing deficiency in a RTL-input program, comprising the steps:
   (a) creating partial RTL description data containing logic description identical with logic description extracted from successive portions of input RTL description data, and having correspondence in signals identical with the same in said input RTL description data;
   (b) executing a RTL-input program with said partial RTL description data created to create an execution log to be analyzed, said partial RTL description data being received as input data to create error-judgment data indicative of whether said RTL-input program contains deficiency;

(c) controlling a volume of logic description contained in partial RTL description data to be next created, based on said error-judgment data and on a number of logic description sentences contained in the input RTL description data; and (d) outputting partial RTL description data causing the same deficiency as deficiency of said input RTL description data, and having a minimum volume of logic description, wherein said step (d) comprises:
fixating a first limit of a range in which logic description is to be extracted from said input RTL description data, at one of first and final logic description sentences of said input RTL description data, and setting a second limit of said range variable, determining partial RTL description data which includes logic description sentences starting from a logic description sentence disposed at said fixated first limit in said input RTL description data, causes the same deficiency as deficiency of said input RTL description data, and has a minimum volume of logic description, fixating said second limit at a logic description sentence disposed at a limit of the thus determined partial RTL description data, and setting said fixated first limit variable, and determining partial RTL description data which includes logic description sentences starting from a logic description sentence disposed at said fixated limit of said determined partial RTL description data, causes the same deficiency as deficiency of said input RTL description data, and has a minimum volume of logic description.

8. The method as set forth in claim 7, further comprising storing said partial RTL description data and said error-judgment data into a memory.

9. The method as set forth in claim 7, further comprising storing said partial RTL description data into a first memory, and storing said error-judgment data into a second memory.

10. The method as set forth in claim 7, wherein said step (b) comprises:
on receipt of said partial RTL description data as input data, executing a RTL-input program to create an execution log; and
analyzing said execution log to create error-judgment data indicative of whether there is deficiency in said RTL-input program.

11. A computer readable medium storing a computer program for causing a computer to carry out a method of giving assistance in analyzing deficiency in a RTL-input program, wherein steps executed by said computer in accordance with said computer program include:

(a) creating partial RTL description data containing logic description identical with logic description extracted from successive portions of input RTL description data, and having correspondence in signals identical with the same in said input RTL description data;

(b) executing a RTL-input program with said partial RTL description data created to created an execution log to be analyzed, said partial RTL description data being received as input data to create error-judgment data indicative of whether said RTL-input program contains deficiency;

(c) controlling a volume of logic description contained in partial RTL description data to be next created, based on said error-judgment data and on a number of logic description sentences contained in the input RTL description data; and (d) outputting partial RTL description data causing the same deficiency as deficiency of said input RTL description data, and having a minimum volume of logic description, wherein said step (d) comprises:
fixating a first limit of a range in which logic description is to be extracted from said input RTL description data, at one of first and final logic description sentences of said input RTL description data, and setting a second limit of said range variable, determining partial RTL description data which includes logic description sentences starting from a logic description sentence disposed at said fixated first limit in said input RTL description data, causes the same deficiency as deficiency of said input RTL description data, and has a minimum volume of logic description, fixating said second limit at a logic description sentence disposed at a limit of the thus determined partial RTL description data, and setting said fixated first limit variable, and determining partial RTL description data which includes logic description sentences starting from a logic description sentence disposed at said fixated limit of said determined partial RTL description data, causes the same deficiency as deficiency of said input RTL description data, and has a minimum volume of logic description.

* * * * *